(12) United States Patent
Isvan

(10) Patent No.: US 8,948,418 B2
(45) Date of Patent: *Feb. 3, 2015

(54) NOISE MASKING COMMUNICATIONS APPARATUS

(75) Inventor: Osman K. Isvan, Aptos, CA (US)

(73) Assignee: Plantronics, Inc., Santa Cruz, CA (US)

( * ) Notice: Subject to any disclaimer, the term of this patent is extended or adjusted under 35 U.S.C. 154(b) by 1004 days.

This patent is subject to a terminal disclaimer.

(21) Appl. No.: 11/985,113

(22) Filed: Nov. 13, 2007

(65) Prior Publication Data

US 2013/0208907 A1    Aug. 15, 2013

Related U.S. Application Data

(62) Division of application No. 09/990,097, filed on Nov. 20, 2001, now Pat. No. 7,349,547.

(51) Int. Cl.
*H03G 3/00*    (2006.01)

(52) U.S. Cl.
CPC .................................... *H03G 3/001* (2013.01)
USPC ............................................. 381/104; 381/74

(58) Field of Classification Search
USPC ............. 381/74, 77, 376, 91, 92, 362, 14–16, 381/18, 21, 23, 26, 337, 338, 102, 58, 60, 381/121, 122, 62–65, 4; 181/20, 22; 379/430; 455/570, 575.2, 575.4, 569

See application file for complete search history.

(56) References Cited

U.S. PATENT DOCUMENTS

| | | | | |
|---|---|---|---|---|
| 4,922,547 | A * | 5/1990 | Murata | 455/79 |
| 5,761,298 | A * | 6/1998 | Davis et al. | 379/430 |
| 6,016,347 | A * | 1/2000 | Magnasco et al. | 379/430 |
| 6,061,456 | A * | 5/2000 | Andrea et al. | 381/71.6 |
| 6,768,804 | B1 * | 7/2004 | Isvan | 381/376 |
| 7,190,797 | B1 * | 3/2007 | Johnston et al. | 381/74 |
| 7,349,547 | B1 * | 3/2008 | Isvan | 381/104 |
| 2003/0003969 | A1 * | 1/2003 | Tong et al. | 455/568 |

* cited by examiner

*Primary Examiner* — Lun-See Lao

(57) ABSTRACT

A communications headset has a microphone boom that is moveable through various distances from the user's mouth, in which movement of the boom operates electrical, mechanical or acoustic mechanisms to adjust the transmit sensitivity of the headset such that the ratio of the amplitude of the output signal of the headset to the amplitude of the sound pressure at the vicinity of the user's mouth is maintained relatively constant, independently of the position of the microphone boom.

21 Claims, 11 Drawing Sheets

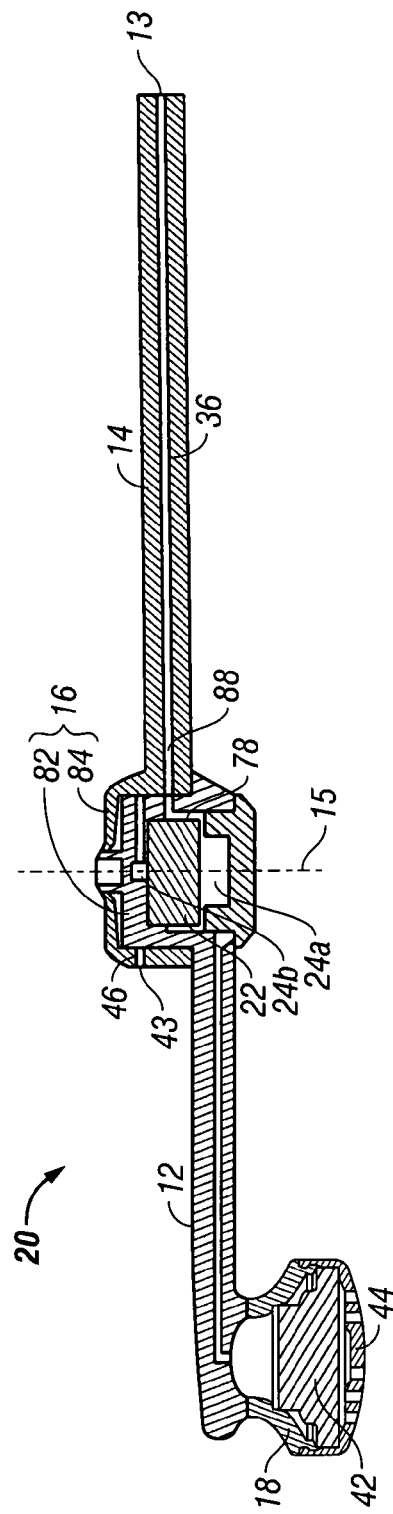
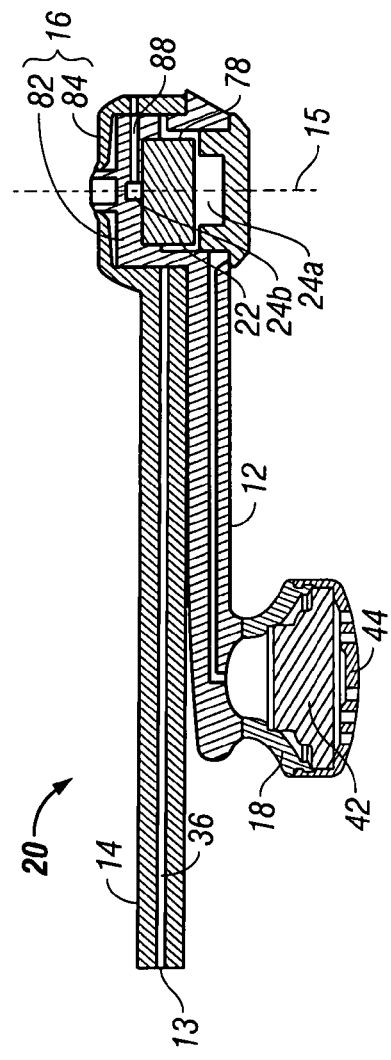
FIG. 11A
FIG. 11B

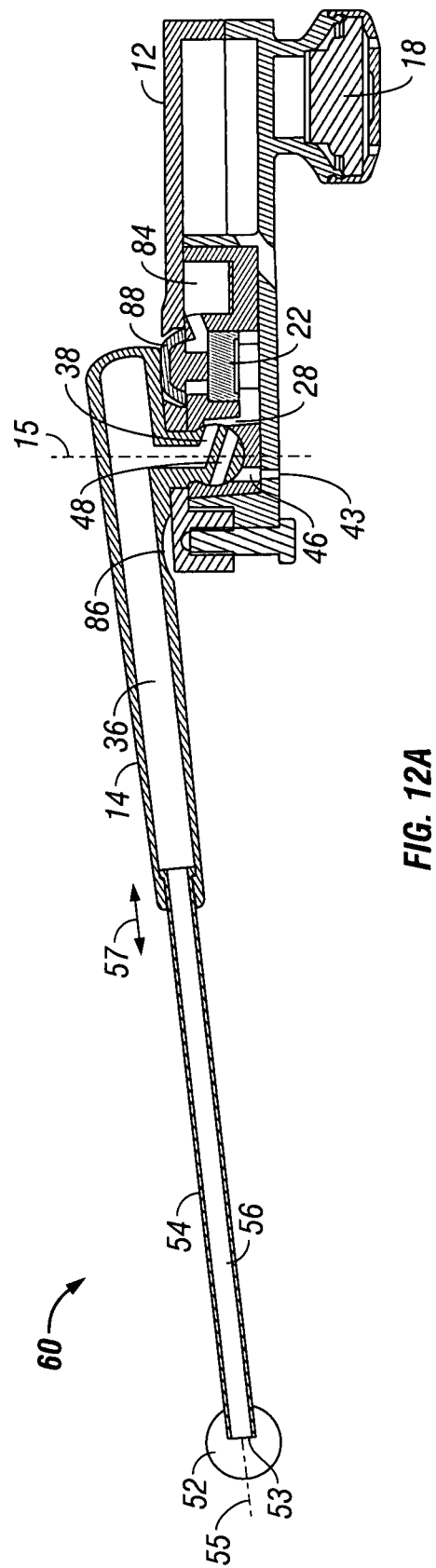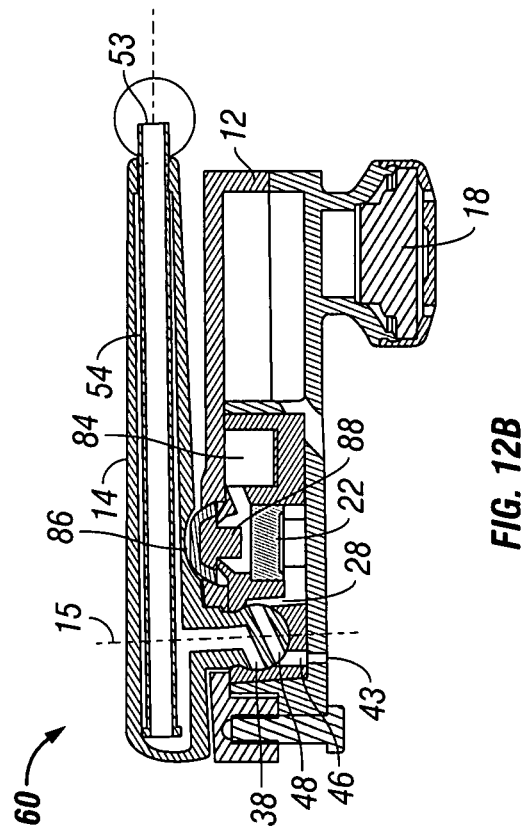
FIG. 12A
FIG. 12B

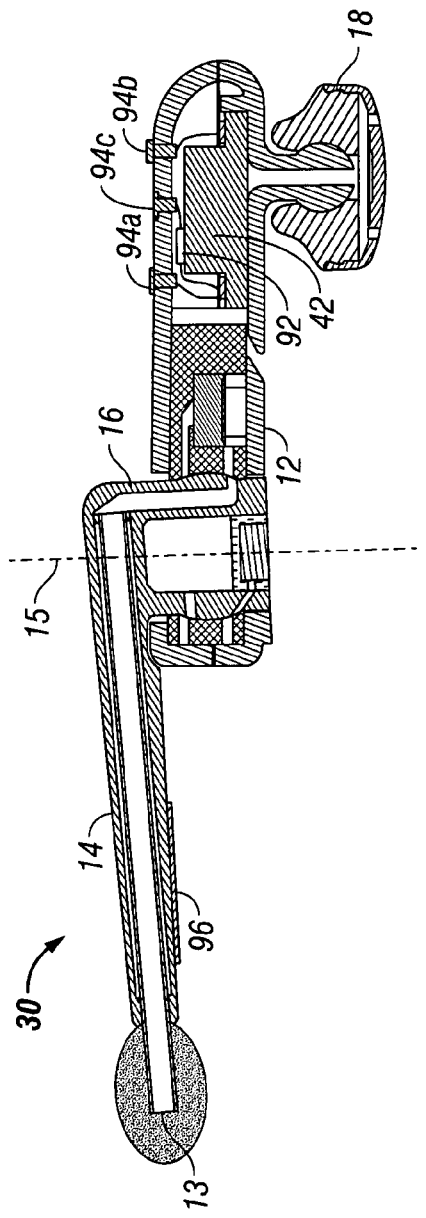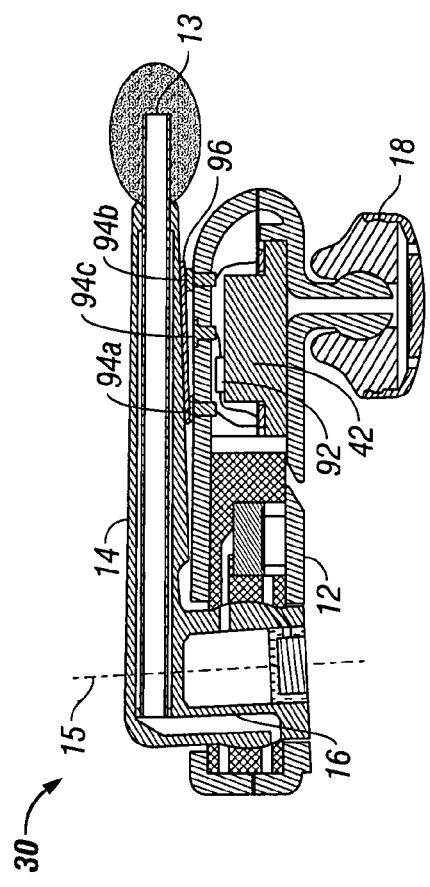
FIG. 13A
FIG. 13B

NOISE MASKING COMMUNICATIONS APPARATUS

RELATED APPLICATIONS

This is a divisional of U.S. patent application Ser. No. 09/990,097, filed Nov. 20, 2001 now U.S. Pat. No. 7,349,547, the entire disclosure of which is incorporated herein by reference.

BACKGROUND

This disclosure relates generally to communication devices, and more particularly, to communication headsets that utilize a movable microphone boom.

Communications headsets can be used in a wide range of applications, and are particularly effective for use with mobile communications devices, such as cellular telephones. The use of communications headsets with mobile communications devices depends heavily on the headsets' ability to provide consistently high transmit signal quality, of which one important measure is the signal-to-noise ratio (i.e., the ratio between the level of the signals associated with the desired acoustic source, such as the user's voice, and those from ambient noise). Hence, it is desirable for communications headsets to include mechanisms that can provide a high signal-to-noise ratio when the headsets are used in noisy environments. It is particularly advantageous to be able to reduce the obscuring effect of ambient noise in the transmit signals when the headsets are used outdoors.

Previous noise reduction designs often involve complicated, expensive electrical circuitry, which are both delicate and prone to errors. For example, noise-canceling microphones, i.e., microphones that are more sensitive to sound waves approaching in certain directions relative to the others, have been designed for use in noisy environments. These microphones are constructed such that both sides of their diaphragms are exposed to sound waves, and reduce the noise content of the transmit signals, thereby increasing the signal-to-noise ratio. Another class of solutions involves the use of sophisticated signal processing techniques to reduce the level of noise content in the transmit signals. Both types of solutions have certain deficiencies.

Noise-canceling microphones are typically placed at the end of a long boom so that they can be aimed toward the user's mouth. When used in a noisy environment, a noise-canceling microphone can increase the signal-to-noise ratio of the output signals for two reasons. First, provided the microphone is aimed toward the user's mouth, sound waves from the user's voice approach the microphone in or near its direction of maximum sensitivity. The ambient noise, on the other hand, is usually diffuse, and approaches from many different directions. Thus, only a small portion of the noise approaches the microphone in the direction of its highest sensitivity. Even if the noise source is non-diffuse, i.e., the noise originates from one or a few specific directions, there is a high probability that a large portion of the noise approaches from directions in which the microphone is relatively insensitive.

The second reason for the increase in signal-to-noise ratio relates to a phenomenon known as the "proximity effect." In essence, the proximity effect relates to directional microphones responding strongly to sound waves from nearby sources. This is because, by virtue of the curvature of the wave fronts of sound originated from a small, nearby source, the amplitude difference between the arrivals of the waves to the front and to the rear of the microphone's diaphragm becomes significant, particularly at low frequencies. The noise-canceling microphone is therefore more sensitive to the user's voice than to the ambient noise from more distant sources.

The advantages of a noise-canceling microphone can be realized only if the acoustic sensing point is disposed close to the user's mouth and appropriately positioned (i.e., in front of, rather than behind, the cheekbone). To satisfy these conditions generally requires a sufficiently long boom that provides the user with enough flexibility to direct or aim the microphone toward his or her mouth. In addition, the improved performance of a noise-canceling microphone depends largely on the assumption that the ambient noise is diffuse or that it approaches from an angle outside the microphone's angular range of maximum sensitivity, which is not always the case. Moreover, noise-canceling microphones are known to be more susceptible to wind noise than omnidirectional microphones because of the pressure turbulence resulting from wind blowing on the microphone. In fact, as the directivity factor of a noise-canceling microphone increases, so does the ratio of wind noise sensitivity to voice sensitivity.

Long booms, which place the acoustic sensing point near the user's mouth, as required for effective noise canceling, are not always desirable in communications headsets. Headsets with short booms or no booms at all are sometimes appealing because of their unobtrusiveness, more stylish appearance and easy stowability. This is particularly the case with users of portable communication applications, such as mobile phones. It is therefore desirable that communications headsets be designed with multiple modes of operation, including at least a mode featuring a long boom extending near the user's mouth to communicate in noisy environments, and a compact mode that provides convenience when ambient noise is not a problem.

There are other methods that employ signal processing techniques to reduce the undesirable effect of ambient noise in the transmit signals. One such technique is voice expansion, which is a form of dynamic signal processing that dynamically adjusts the amplification gain (i.e., the ratio between the levels of the amplified output signals and the raw electrical signals as converted by the microphone from acoustic signals before the amplification takes place) as a function of the transmit signal level. Hence, when a communications headset equipped with a voice expansion mechanism is used in a noisy environment, voice expansion serves to reduce the level of output signals, including both the signals originating from the desired source and the ambient noise when the signal level is low.

A related problem with conventional communications headsets that operate in multiple modes with different boom lengths is that of sound distortion in the audio transmission. The limited dynamic range of telephone lines or wireless channels may result in distortion in the transmission. In addition, noise-canceling microphones have different frequency response curves for acoustic sources located at different distances due to the proximity effect above. Further, even if an omnidirectional microphone is used, there may still be a shift in the sound spectrum associated with any change in the location of the acoustic sensing point relative to the user's mouth. This is because high frequencies are attenuated more than low frequencies when the sound travels through air.

Accordingly, it is desirable to provide a communications headset using different boom lengths to operates in multiple modes with a mechanism that automatically adjusts the headset for optimal voice sensitivity in each mode, and that is simple and inexpensive to make and use.

SUMMARY

In accordance with the present disclosure, the limitations of conventional communications headsets are overcome by the provision of a communications headset having multiple modes of operation, at least one of which includes the placement of the voice sensing point of the headset close to the user's mouth, that incorporates a mechanism for automatically adjusting the headset for optimal voice sensitivity in each of its operating modes.

According to one aspect of this disclosure, a communications apparatus capable of providing an output signal in response to sound pressure in the vicinity of a desired sound source operates in multiple modes corresponding to the different positions of a movable microphone boom, such that the ratio of the amplitude of the output signal to the amplitude of sound pressure in the vicinity of the desired source remains substantially the same independently of the operating mode, i.e., independently of the position of the microphone boom. This is accomplished by changing the ratio of the amplitude of the output signal to the amplitude of sound pressure at the acoustic sensing point of the boom in response to the position of the boom. In at least one of the multiple modes of operation, sound waves are received at an acoustic sensing point located close to the desired acoustic source, thus enabling a high signal-to-noise ratio in the audio transmission.

In a communications headset application of this aspect, the headset comprises a microphone and a boom movably coupled to a main body and adapted to be positioned in various positions relative to the headset and a desired sound source, and is adapted to receive acoustic signals through an acoustic sensing point located at an opening of the boom. In at least one operating mode of the headset, a noise masking mechanism is activated so as to reduce the ratio of the amplitude of the output signal to that of the sound pressure at the sensing point by placing the acoustic sensing point relatively close to the desired sound source. Since the ambient noise is masked by the user's voice in this mode of operation, this reduction in the headset's sensitivity effectively lowers the transmitted level of ambient noise without changing the transmitted level of the user's voice.

In another embodiment of this aspect, a directional microphone is employed in conjunction with one or more enclosed acoustic cavities to which the microphone's diaphragm is selectively acoustically coupled, and in which the respective volumes of the cavities are adjusted as a result of the boom's position. Yet another embodiment includes acoustic channels in the body of the boom that are variously shaped, sized or arranged to induce different levels of transmission loss.

In another embodiment of this aspect, a switch coupled to the boom is operable to control a circuit that changes either the microphone bias or the amplification gain applied to the microphone signal.

In another aspect, the movable boom also enables the implementation of a frequency compensation mechanism. A communications headset that includes transmit frequency compensation comprises a frequency response compensation circuit electrically coupled to the microphone and adapted to compensate for shifts in input frequency spectrum as a function of the distance between the acoustic sensing point and the source, and/or for shifts in the frequency response of a noise-canceling microphone, as a function of the distance between the microphone and the source.

A headset in accordance with this aspect of the disclosure may be underutilized. For example, an inexperienced user may keep the headset in the folded-boom mode even in noisy environments, unless the person at the opposite end of the communication line complains about noise. Therefore, according to a second aspect of the present disclosure, the receive sensitivity (i.e., the ratio of the amplitude of the acoustic signals output by the receiver to the amplitude of the corresponding electrical signals received from the remote user) is reduced when the headset operates in a mode that places the acoustic sensing point relatively far away from the user's mouth. Thus, the user will be encouraged to use this mode only in a sufficiently quiet environment. This aspect of the disclosure enables the receive sensitivity to be high enough to be used in a noisy environment, yet low enough to avoid "squealing" when the headset operates in a mode that places the acoustic sensing point relatively close to the receiver. In addition, this aspect of the disclosure minimizes the level of the speech echo that is audible to the remote user if the line has a noticeable signal delay, such as packet delay, that is common in digital telecommunications. When both aspects of the disclosure are employed, the sum of Transmit Loudness Rating (TLR) and Send Loudness Rating (SLR) can be maintained at the highest level possible without squealing or echo problems in the multiple modes of operation of the device.

A better understanding of the above and many other features and advantages of the communications apparatus of the present disclosure can be obtained from a consideration of the detailed description of some exemplary embodiments thereof below, particular if such consideration is made in conjunction with the appended drawings, wherein like reference numbers are used to refer to like elements in the respective figures thereof.

BRIEF DESCRIPTION OF THE DRAWINGS

FIGS. 11(a) and 11 (b) are cross-section views of another exemplary headset, showing the headset in an extended and a compact mode of operation, respectively;

FIGS. 12(a) and 12 (b) are cross-section views of another exemplary headset, showing the headset in a doubly extended and a compact mode of operation, respectively; and, FIGS. 13(a) and 13(b) are cross-section views of another exemplary headset in which a receive gain of the headset is adjusted in response to the position of a boom thereof.

DETAILED DESCRIPTION

Figure 1:
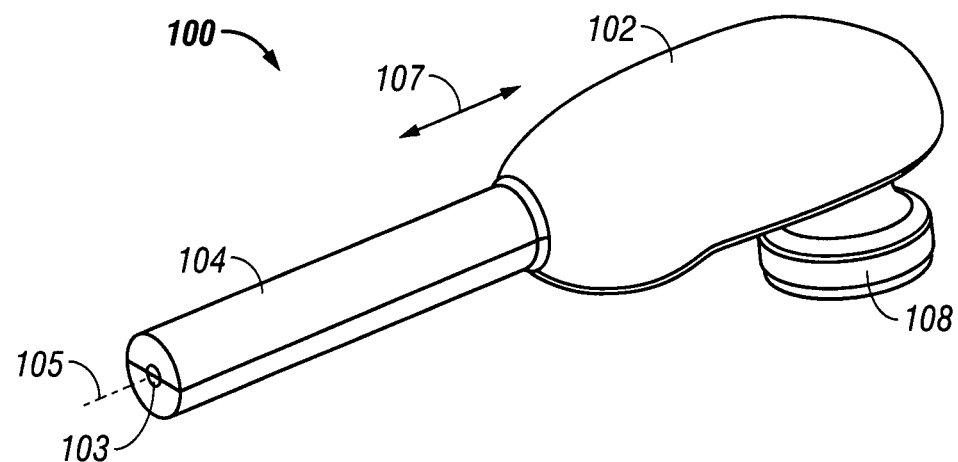
FIG. 1 is a perspective view of a exemplary embodiment of a communications headset in accordance with the present disclosure, showing a slidable boom of the headset in an extended position.

Various exemplary embodiments of communications headsets utilizing a movable boom to enable noise masking mechanisms are described below. In the following description, for purposes of explanation, numerous specific details are set forth in order to provide a thorough understanding of the disclosure. The art of headset design and acoustic engineering are such that many different variations of the illustrated and described features of this disclosure are possible. As those of skill in the art will appreciate, the disclosure can be practiced without some of the specific details described below, and indeed, will see that other variations and embodiments of the disclosure can be practiced while still satisfying the teachings hereof.

According to one aspect of the present disclosure, a communications headset having a moveable boom with an acoustic sensing point thereon operates in multiple modes corresponding to different positions of the boom that dispose the sensing point at different distances from a desired sound source, e.g., a user's mouth, and still provides a voice sensitivity (i.e., ratio of the amplitude of the output signals of the headset to the amplitude of the sound pressure at the vicinity of the user's mouth) that is relatively constant, independent of the operating mode, i.e., the position of the boom, of the headset. In at least one of the multiple modes of operation, sound waves are received close to the desired acoustic source, enabling a high signal-to-noise ratio in the audio transmission. According to this aspect, a "noise masking" mechanism may be activated in the high signal-to-noise operating mode of the headset to reduce the sensitivity of the headset to the ambient acoustic noise. Since the noise content at the acoustic sensing point is low relative to the desired signals in this mode of operation (i.e., the noise is masked by the user's voice), a reduction in sensitivity to sound pressure at the sensing point, together with a corresponding reduction in the distance between the sensing point and the user's mouth, effectively combine to reduce the noise in the transmitted signal without changing the headset's voice sensitivity. In the following description, the first aspect of the present disclosure is discussed first with respect to several exemplary embodiments thereof. The structures of the described embodiments are then referenced in the discussion of the second aspect of the disclosure. Three types of noise masking techniques are described in detail, based on electrical, mechanical and acoustic mechanisms, respectively. Following these discussion, additional aspects of the present disclosure are discussed.

Communication Headsets with Multiple Modes of Operation Corresponding to Multiple Boom Positions According to a first aspect of the present disclosure, the needs for compactness and a satisfactory output signal quality can be achieved in communications headsets with microphone booms that operate in multiple modes. For example, there can be a compact mode that allows for stowability and style, as well as an extended mode that provides a relatively high signal-to-noise ratio, by virtue of the extended boom placing the acoustic sensing point relatively close to the user's mouth. The term "acoustic sensing point" is used herein to refer to the point (or more generally, location) in space at which a communications headset collects sound waves. For example, the acoustic sensing point of a headset with a long boom may be located at an opening at the distal end of the boom. Hence, the user can select the extended mode when loud noise from wind or other undesirable sources could obscure the user's voice if the acoustic sensing point were disposed further away. As discussed below, a noise masking mechanism can also be implemented in the extended mode of operation.

An exemplary embodiment of a multiple mode communications headset 100 in accordance with the present disclosure is illustrated in FIG. 1. The exemplary headset 100 has a slidable microphone boom 104 that is adapted to telescopically extend or retract with respect to an elongated main body 102 along a long axis 105 of the boom, as indicated by the arrow 107. The positioning of the boom 104 is facilitated by the provision of a boom adjustment knob 106 on the headset. Sound waves are received at an opening 103 at the distal end of the boom 104, which thereby functions as the acoustic sensing point of the headset. A microphone (not seen in FIG. 1) can be enclosed within the main body 102, or alternatively, disposed immediately adjacent to the opening 103. In the former case, the boom 104 includes a sound tube (not seen in FIG. 1) that conveys the sound waves to the microphone in the main body. In the latter case, the microphone and its attached electrical wirings move together with the boom 104.

Also illustrated in FIG. 1 is an earpiece 108 disposed adjacent to one end of the main body 102, with a generally pill-shaped configuration and preferably having a foam elastomer or other soft type of covering. The earpiece 108 is designed both as a mounting device that enables a user to wear the headset 100, and as an encasement for a receiver element (not seen in FIG. 1). It will be readily apparent to one skilled in the art that alternative configurations and sizes of earpieces may be provided with the headset 100. Depending on the headset type, the earpiece 18 may be positioned inside the concha (i.e., the cavity surrounding the opening to the ear canal) of the user's ear (an intra-concha headset), may rest against the pinna (a supra-aural headset), or may surround the pinna (a circum-aural headset). FIG. 1 illustrates an intra-concha headset, as an example.

Figure 2A:
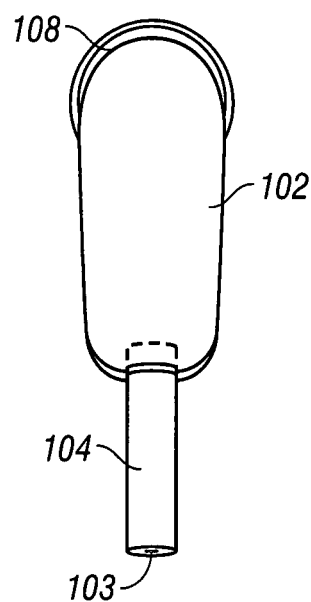
FIGS. 2(a)-2(c) are schematic plan views of the exemplary headset of FIG. 1, showing the boom in a fully extended, partially retracted, and fully retracted position, respectively.
Figure 2B:
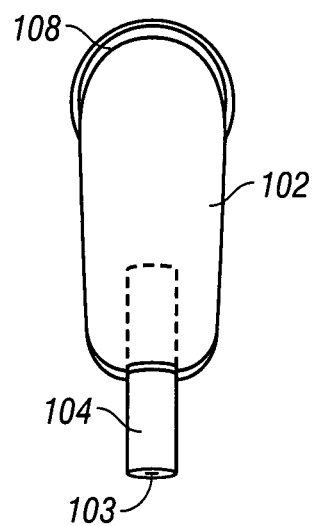

The communications headset 100 has at least two modes of operations. FIG. 2(a) is a schematic illustration of a first, extended mode of operation, with the slidable boom 104 shown fully extended. FIG. 2(b) illustrates another extended mode in which the boom 104 is only half extended. When the headset 100 is used in the extended mode of operation, the acoustic sensing point, located at the opening 103, can be disposed relatively close to the desired acoustic source, typically, the user's mouth. This mode therefore corresponds to a high signal-to-noise ratio and is suitable for the implementation of the noise masking mechanisms discussed in detail below.

Figure 2C:
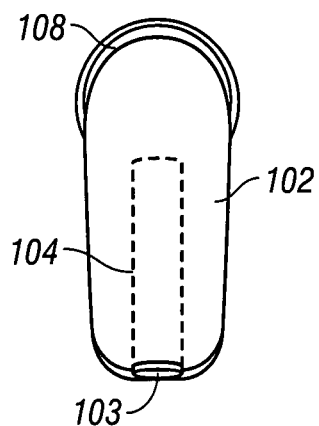

FIG. 2(c) illustrates a second, compact mode of operation of headset 100. In this mode of operation, the boom 104 is fully retracted into and hidden inside the main body 102. The acoustic sensing point, still located at opening 103, is therefore disposed at the end of the elongated main body 102, and hence, further away from the desired acoustic source. The signal-to-noise ratio of the headset 100 in this compact operating mode is typically lower than that in the extended mode, since the acoustic sensing point 103 is disposed at a location further away from the user's mouth.

Figure 3:
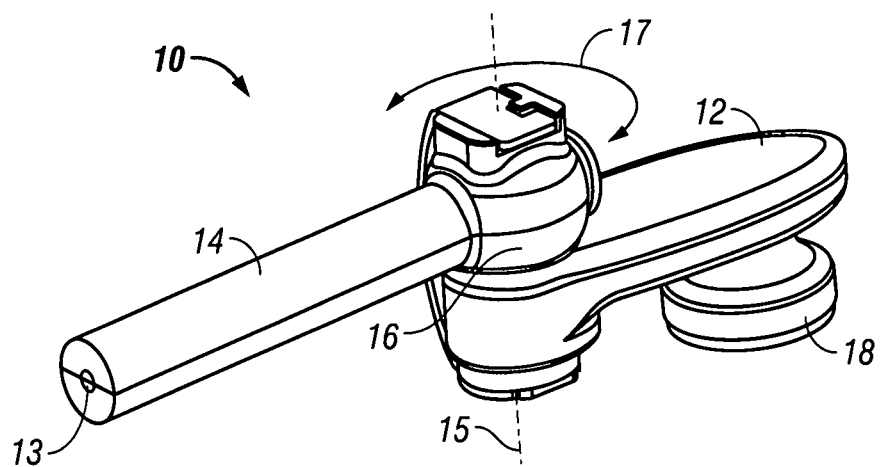
FIG. 3 is a perspective view of another exemplary headset, showing a foldable boom of the headset in an extended position.

Another exemplary embodiment of a communications headset 10 in accordance with the present disclosure is illustrated in FIG. 3. The headset 10 includes an elongated main body 12 having an earpiece 18 coupled to it. An adjustable boom 14 is movably coupled to the main body 12 at a pivoting hinge 16, the structure of which is described in more detail below. An axis of rotation 15 at the centerline of the hinge 16 passes through the main body 12 and the boom 14. The hinge 16 enables an angular pivoting movement of boom 14 with respect to the main body 12 and about the axis 15, as indicated by the arrow 17. This freedom to rotate enables the boom 14 to be positioned at a wide range of angles relative to the main body 12.

FIG. 3 illustrates the extended mode of operation of the headset 10. As described above, the boom 14 has an opening 13 at its distal end which functions as the acoustic sensing point in this operating mode. Hence, sound waves are received by the headset 10 through the opening 13. It will be readily apparent to those skilled in the art that, in other embodiments of the present disclosure, the acoustic sensing point need not be located on the boom 14, but rather, can be located at various other locations so long as it serves as an entrance through which sound waves can reach the microphone.

Figure 4A:
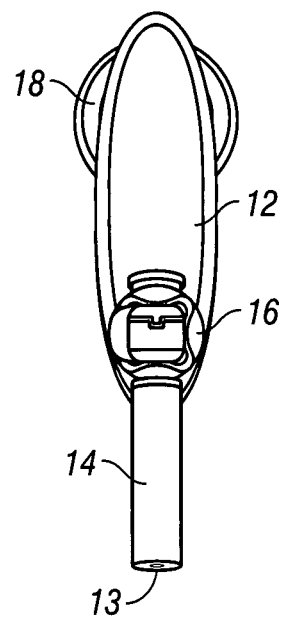
FIGS. 4(a)-4(c) are schematic plan views of the headset of FIG. 3, illustrating the arrangement of the foldable boom when operating in different modes.
Figure 4B:
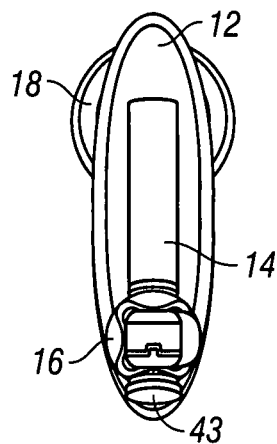
Figure 4C:
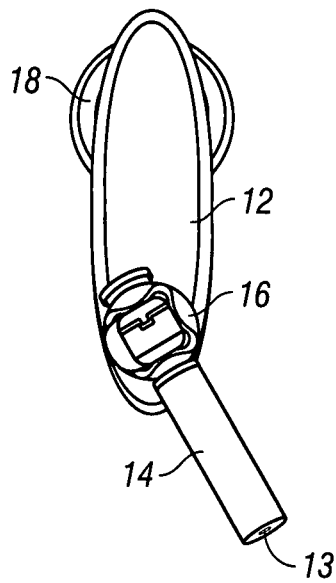

In the headset 10, when the boom 14 is disposed at certain predetermined positions or ranges of positions, the microphone is acoustically coupled to predetermined locations on the headset 10 that function as the acoustic sensing point, as discussed in more detail below. Hence, the communications headset 10 has multiple operating modes, each corresponding to a different position or range of positions of the boom 14. At a minimum, these operating modes include an extended mode in which the boom 14 is unfolded, as shown schematically in FIG. 4(a), and a compact mode when the boom 14 is rotated to a position directly on top of the main body 12, as shown in FIG. 4(b). Since the schematic illustrations in FIG. 4 are provided primarily to show the different arrangement of the relevant elements of headset 10 when it is operating in different modes, many details of the headset 10 are omitted for simplicity. However, the schematic diagrams include the respective locations of the acoustic sensing point, which is shown to have moved from a first opening 13 on the boom 14 in FIG. 4(a) to a second opening 43 of the boom 14 in FIG. 4(b). In certain embodiments of the present disclosure, there may be intermediate positions of the boom 14 that correspond to additional modes of operation. FIG. 4(c) illustrates one such intermediate boom position.

As in the first exemplary headset 100 above, the microphone can be disposed in either the main body 12 or in the microphone boom 14. Unlike the headset 100, however, the acoustic sensing point of the headset 10 moves from a first opening at one end of the boom 14 to a second opening at the other end of the boom 14 when the headset 10 changes its operating mode, so that the acoustic sensing point is always located close to the user's mouth. Thus, if it is desired that the microphone be disposed near the acoustic sensing point, two microphones may be needed for use in the two modes of operation. If a single microphone is used, it is desirable to provide an "acoustic valve" that is capable of coupling a different acoustic channel to the microphone in each mode in order to couple the single microphone to the operative acoustic sensing point. Such an acoustic valve is described in more detail below.

Figure 5A:
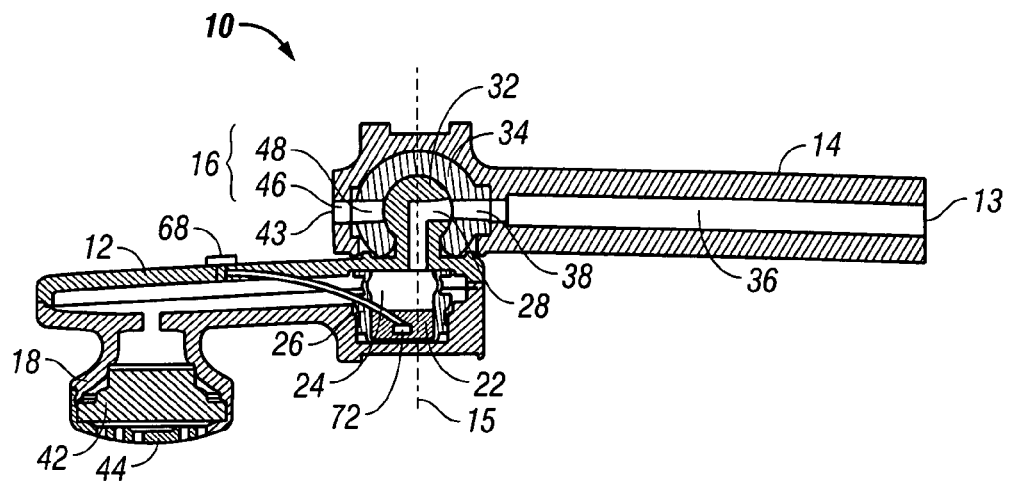
FIGS. 5(a) and (b) are cross-section views of the headset of FIG. 3, showing the headset in an extended and a compact mode of operation, respectively.

Referring to FIG. 5(a), there is shown a cross-sectional view of a single-microphone embodiment of the headset 10 taken at the vertical mid-plane. The main body 12 is shown to encapsulate various electrical, acoustical, and mechanical components at its right end, including a microphone 22 and an adjacent acoustic cavity 24, both encased in a microphone boot 26. Above the acoustic cavity 24 is a ball-and-socket pivoting hinge 16, comprising a pivot ball 32 and a pivot socket 34, the latter being adapted to rotate freely relative to the former and about the axis 15. As the socket 34 rotates about the axis 15, the boom 14 pivots about the axis 15. The boom 14 encases a sound tube 36 that terminates in an opening 13 that functions as the acoustic sensing point in the extended mode of operation, as discussed above. It will be readily apparent to those skilled in the art that the pivoting hinge 16 may take other forms, such as a cylindrical pin-and-tube arrangement, as discussed below.

According to one aspect of the present disclosure, sound is collected at the acoustic sensing point from a desired acoustic source. The term "desired acoustic source," as used herein, refers to the location at which the user generates the sound signals to be transmitted by the headset 10, and is typically disposed away from the main body 12 of the headset in the direction of the unfolded boom. Typically, the desired acoustic source is the user's mouth, and the communications headset 10 is preferably designed and dimensioned to extend between a typical user's mouth and his left or right ear, in which the earpiece 18 is disposed when the headset 10 is in use. With the microphone 22 enclosed in the main body 12, sound from the desired acoustic source is conducted through various acoustic channels to the microphone 22, the particular channel utilized depending on the mode in which the headset 10 is operating, that is, the position of the boom 14.

As used herein, an "acoustic channel" is simply a path of transmission of sound waves that may include one or more sound tubes, by way of example. In the embodiment depicted in FIG. 5(a), the active acoustic channel comprises the sound tube 36, a short link tube 38 in the pivot socket 34, and a bent link tube 28 in the pivot ball 32. These various channels 36, 38, and 28 together acoustically couple the acoustic sensing point at opening 13 to the microphone 22 and the associated acoustic cavity 24. As illustrated in FIG. 5(a), a second, relatively short, sound tube 46 is located at the other end of boom 14. This second sound tube 46 terminates at one end in a second opening 43, and on the opposite end, connects to a second link tube 48 in the pivot socket 34. These acoustic elements provide an alternative sound reception mechanism for the headset 10 when operating in a different mode.

Thus, the pivoting hinge 16, together with its various link tubes, functions as an acoustic valve, as discussed below. It should be noted that the acoustic pressure from the user's voice will be higher at the point 13 in FIG. 5(a) than at the point 43 in FIG. 5(b), whereas, the acoustic pressure from an ambient noise source is typically at essentially the same level at both points, due to the relatively large distance between the ambient noise source and the headset. Persons trained in the art will recognize, however, that after reaching the sensing point, all sound waves propagate to the microphone essentially without any loss in acoustic intensity, due to plane-wave conditions within the sound tube 36.

Figure 5B:
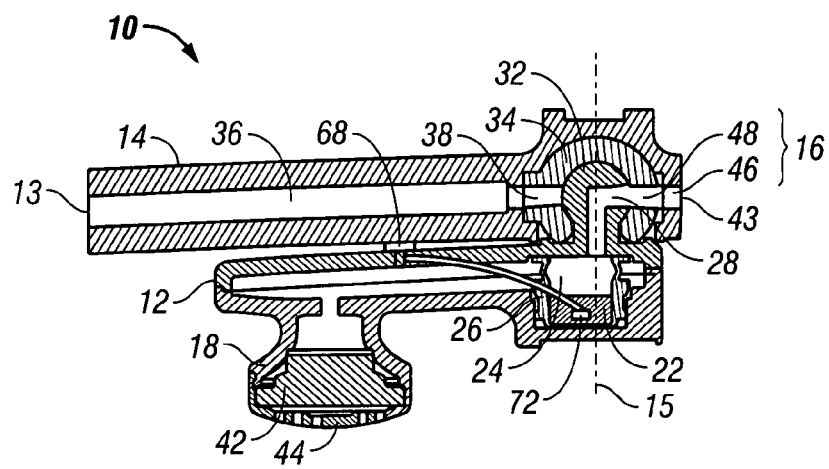

FIG. 5(b) is a second cross-sectional view of the communications headset 10 taken at the vertical mid-plane. The headset 10 is depicted here in the compact mode of operation, with the boom 14 placed directly on top of the main body 12, corresponding to the case illustrated schematically in FIG. 4(b). In this mode of operation, the acoustic valve 16 is operable to acoustically couple the microphone 22 to the opening 43, which now functions as the acoustic sensing point. Thus, sound from the desired acoustic source is collected at the opening 43 and conducted to the microphone 22 through an alternative acoustic channel comprising the short sound tube 46, the link tube 48 in pivot socket 34, the bent link tube 28 in pivot ball 32 and the acoustic cavity 24.

The shifting of the active acoustic sensing point from the opening 13 to the opening 43 is made possible by the inclusion of two link tubes 38, 48 disposed in the pivot socket 34 on opposite sides of the pivot ball 32. Hence, when the boom 14 is positioned as shown in FIGS. 3 and 5(a), the bent link tube 28 in the pivot ball 32 is acoustically coupled to the link tube 38. When the boom 14 is repositioned, as shown in FIG. 5(b), such that the headset 10 is operating in the compact mode, the socket moves with the boom in such a way that the link tube 48, instead of the tube 38, is acoustically coupled to the bent link tube 28, while the tube 38 remains substantially fixed relative to the main body 12. It is this mechanism of activating an appropriate acoustic channel in response the boom's position that enables the pivoting hinge 16 to function as an acoustic valve.

Figure 6:
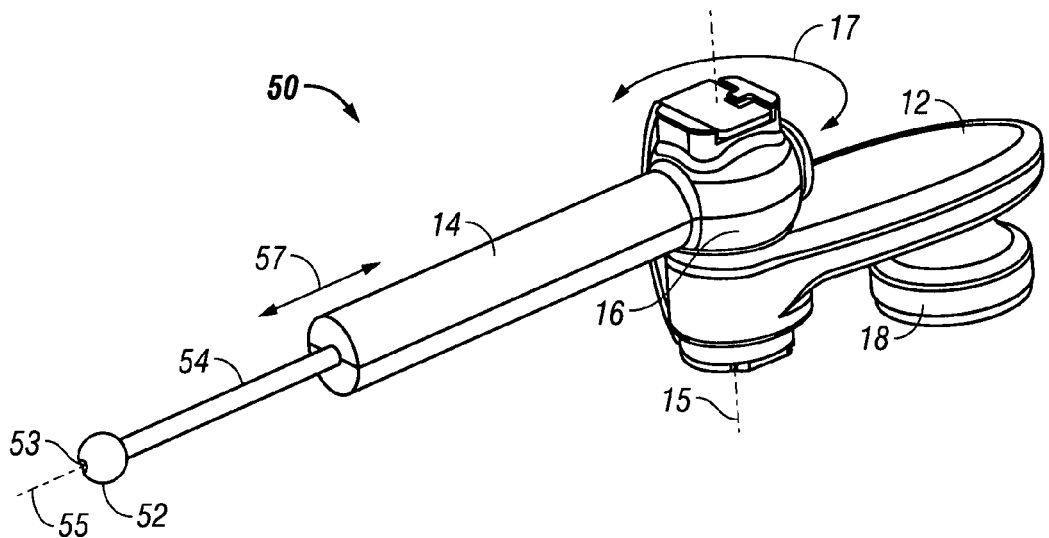
FIG. 6 is a perspective view of another exemplary headset, showing a sliding inner boom of the headset in an extended position.

FIG. 6 illustrates yet another exemplary embodiment of a communications headset 50 in accordance with the present disclosure. Some of the features of the headsets 100 and 10 described above are combined in the headset 50. For example, the headset 50 incorporates some of the basic features of headset 10, including a main body 12 coupled to earpiece 18, and a movable boom 14 that pivots at a hinge 16. Additionally, a secondary, inner boom 54 is slidably engaged within the movable boom 14, enabling the former to be telescopically extended or retracted with respect to the latter along the long axis of the former, as indicated by the arrow 57. Positioning of the secondary boom 54 is facilitated by the provision of a knob 52. Analogous to the opening 103 of the headset 10 illustrated in FIG. 3, an opening 53 at the distal end of the sliding inner boom 54 functions as the acoustic sensing point of the headset 50. In the fully retracted position, the secondary boom 54 is preferably nestled within the boom 14, in direct analogy with the slidable boom 104 of the headset 100.

Figure 7A:
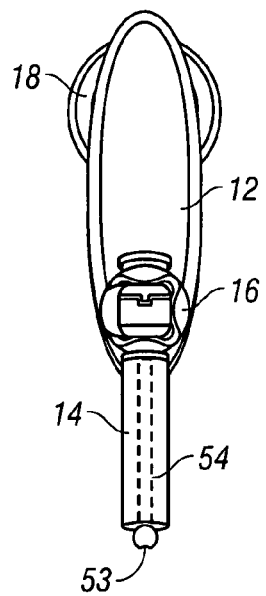
FIGS. 7(a)-7(c) are schematic plan views of another exemplary headset, showing the headset operating in an intermediate, compact, and fully extended mode, respectively.
Figure 7B:
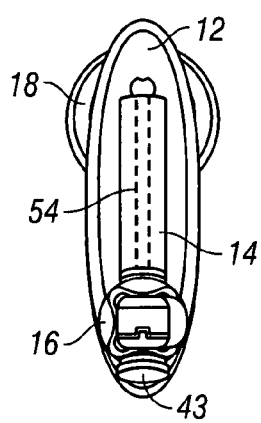
Figure 7C:
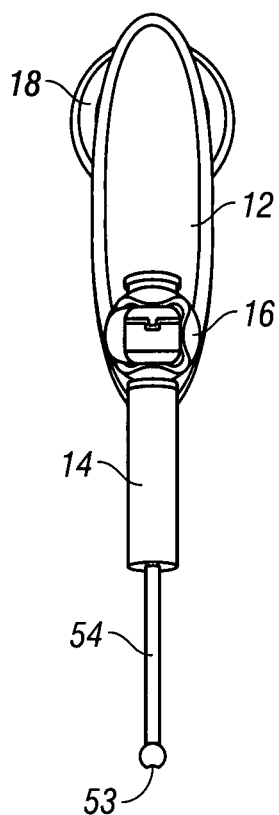

As illustrated schematically in FIG. 7, the exemplary headset 50 of FIG. 6 has at least three modes of operation. As in FIGS. 2 and 4 above, FIG. 7 shows only the elements of the communications headset 50 relevant for the illustration of these different modes of operation. The extended and compact operating modes of the headset 50, as illustrated in FIGS. 7(a) and 6(b), respectively, are analogous to the first two modes of operation of the headset 10 respectively illustrated n FIGS. 4(a) and (b). The primary difference is that the acoustic sensing point in the extended mode is located at an opening 53 at the end of a secondary boom 54, as discussed above, instead of at an opening 13 (see FIG. 4(a)) at the end of boom 14. The third mode of operation of the headset 50, referred to herein as the extended mode, is depicted in FIG. 7(c). This operating mode corresponds to having the inner boom 54 telescoping outward, effectively extending the length of the boom 14, and placing the acoustic sensing point at the opening 53 further away from the main body 12 and the earpiece 18, and towards the desired acoustic source. Note that the amount of telescopic extension of the inner boom 54 beyond boom 14 is preferably adjustably variable so that the user can adjust the location of the acoustic sensing point as appropriate for the situation.

Figure 8A:
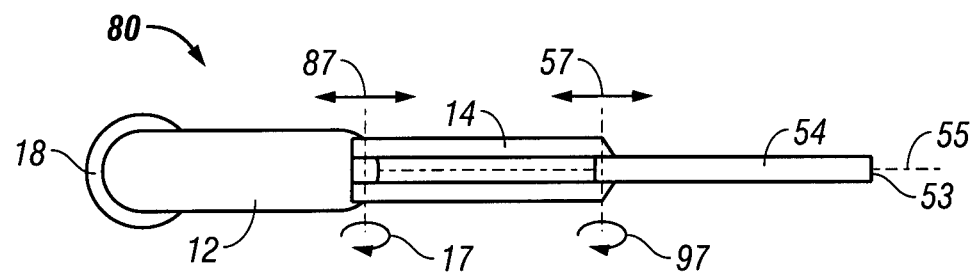
FIGS. 8(a) and (b) are plan views of another exemplary headset, showing the headset in an extended and a compact mode of operation, respectively.
Figure 8B:
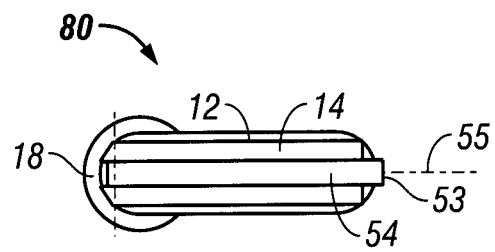
Figure 9A:
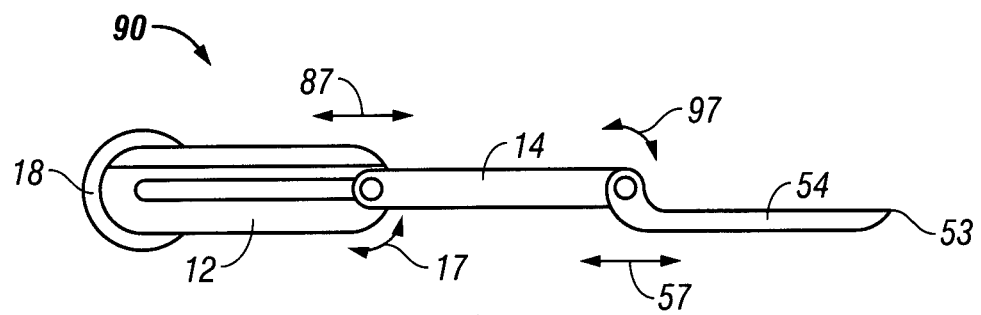
FIGS. 9(a) and (b) are plan views of another exemplary headset, showing the headset in an extended and a compact mode of operation, respectively.
Figure 9B:
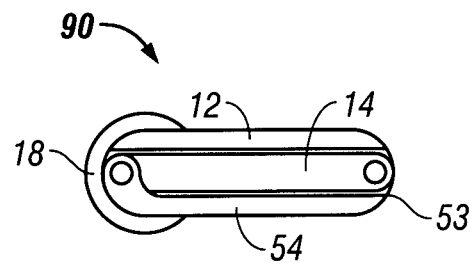

The three headsets 100, 10, and 50 discussed above are but three possible exemplary embodiments of the multiple mode of operation communications headset in accordance with the present disclosure. It will be apparent to those skilled in the art that many different variations of the above can be implemented. For example, the slidable secondary boom 54 in the headset 50 can also be used with a slidable primary boom, as illustrated in the embodiment of FIGS. 8(a) and (b). Alternatively, the secondary boom may be coupled with the primary boom using a pivoting hinge, as illustrated in FIGS. 9(a) and (b). As illustrated in FIGS. 8 and 9, respectively, the secondary boom 54 may either slide in the direction of the arrow 57, or pivot with respect to the primary boom 14 in the direction of the arrow 97. Likewise, the primary boom 14 may either pivot in the direction of the arrow 17 or slide in the direction of the arrow 87 with respect to the main body 12.

Referring to FIGS. 8(a) and (b), there is shown a doubly retractable headset 80 in an extended mode and a compact mode, respectively. The headset 80 shares many features with the headsets 100 and 50 described above. It should be readily apparent to those skilled in the art that the schematic illustrations in FIG. 7 apply to the headset 80, except that the acoustic sensing point of the headset 80 remains at the opening 53 in all modes of operation. It will also be apparent to those skilled in the art that a microphone can be placed at either the distal end of the secondary boom 54, near the opening 53, or within the main body, as in the embodiments above. In the latter case, the primary and second booms 14 and 54 enclose sound tubes that transmit the sound waves to the microphone.

Referring now to FIGS. 9(a) and (b), an exemplary "trifold" headset 90 is illustrated in an extended mode and a compact mode, respectively. Like the headset 80 described above, the headset 90 shares many features with the previously described headsets, in particular, the headsets 10 and 50. Indeed, the schematic illustrations of FIGS. 7(b) and (c) can be seen to apply equally to the headset 90, with the proviso that, in the headset 90, the secondary boom 54 now folds onto the main body 12 and the acoustic sensing point remains at the opening 53.

Noise Masking Mechanisms Utilizing Electrical Means

The multiple operating mode embodiments described above provide a partial solution to the problems associated with communicating in noisy environments. While there is an increase in the signal-to-noise ratio when the extended mode is selected, there is no reduction in the level of noise in the transmit signal. Thus, when the headset is used in noisy environments, the high level of noise can still become a nuisance or a distraction to the remote user at the receiving end. Moreover, due to the limited dynamic range of telephone lines, using the headset in the extended mode in a noisy environment may lead to excessive distortion in the audio transmission because of the high level of input signals from both the user's voice and the ambient noise. This is particularly true if the headset is designed to operate with little output signal headroom in the compact mode, which may be desirable in order for the headset to transmit an adequate level of audio signals despite the relatively low overall level of acoustic signals received.

According to one aspect of the present disclosure, the multiple modes of operation enables the implementation of various noise masking mechanisms in the communications headset 10, 50, 80, 90, or 100 utilizing a movable boom. In one embodiment of the present disclosure, a noise masking mechanism may be implemented to reduce the headset's transmit sensitivity to sound pressure at the acoustic sensing point when the headset 10, 50, 80, 90, or 100 is operating in a mode with a relatively high signal-to-noise ratio. The adjustment in the ratio of the amplitude of the output signal to the amplitude of the input acoustic signal (i.e., the headset's transmit sensitivity) may be accomplished in a variety of ways. For example, a mechanism may be implemented to modify the amplification gain applied to the microphone output signal. Alternatively, the mechanism may be adapted to modify the sensitivity of the microphone or the amount of transmission loss when the sound is being conveyed to the microphone. Each of these types of mechanisms is discussed below.

According to one aspect of the present disclosure, a noise masking mechanism can be implemented electrically by utilizing simple electrical circuitry that modifies the amplification gain applied to the microphone signal. When the microphone 22 receives acoustic signals, it converts them into electrical signals, the amplitude of which depends on the sensitivity of the microphone. The electrical signals are then amplified and become the transmit signals. The ratio of the amplitude of the transmit signal to the amplitude of the electrical signal (as converted by the microphone from acoustic signals) is known as the amplification gain.

In one embodiment according to this aspect of the disclosure, a transmit controller serves to modify the amplification gain. One way of implementing the transmit controller is by installing a boom-activated switch, such as the switch 68 mounted on the main body 12 of the headset 10, which is connected to a controller 72, as illustrated in FIGS. 5(a) and (b). The controller 72 includes circuitry electrically coupled to the microphone 22 that can change the amplification gain to be applied to the electrical signals converted by the microphone 22 from the acoustic signals that it receives. Those skilled in the art will recognize that this can be done in a variety of different ways, including for example, changing an electrical resistance in the circuit.

For example, the switch 68 may be arranged so as to be actuated when the boom 14 is disposed in certain positions, such as when it is rotated on top of the main body 12. When actuated, the switch 68 activates the controller circuit to modify the amplification gain. Thus, when the signal-to-noise ratio is high due to the acoustic sensing point being disposed close to the desired acoustic source, as is the case in the extended mode of operation illustrated in FIG. 5(a), a small amplification gain is applied. In contrast, in the compact mode of operation illustrated in FIG. 5(b), the boom 14 is rotated on top of main body 12, thereby actuating the switch 68, which in turn, activates the transmit controller to increase the amplification gain to compensate for the low sensitivity to sound pressure at the desired sound source.

The decrease of the amplification gain when the acoustic sensing point is disposed close to the desired acoustic source results in a reduction of the noise content in the transmitted signal, which is already low relative to the signals from the desired source. Hence, the noise is effectively masked. Note that, although the switch 68 is illustrated only with headset 10 and shown only in FIGS. 5(a) and (b), the same switch mechanism may also be implemented in the headset embodiments 50, 80, 90 or 100 as well.

An alternative mechanism uses electrical elements to control the sensitivity of the microphone 22. For example, if the microphone 22 is an electret condenser type, its sensitivity depends on the supply voltage and bias resistance. Analogous to the mechanism discussed above for controlling the amplification gain, a boom-actuated switch 68 such as illustrated in FIGS. 5(a) and (b)) can be located on the main body 12 such that it is actuated when the boom 14 is disposed in certain positions, for example, when it is rotated on top of the main body 12. When actuated, the switch activates the control circuit to modify either the supply voltage or the bias resistance associated with the electret condenser type microphone 22. Again, although the switch 68 is illustrated only in the headset 10 and shown only in FIGS. 5(a) and (b), the same switch mechanism is equally applicable to the exemplary headsets 50, 80, 90 or 100.

Noise Masking Mechanisms Utilizing Mechanical Means

Figure 10A:
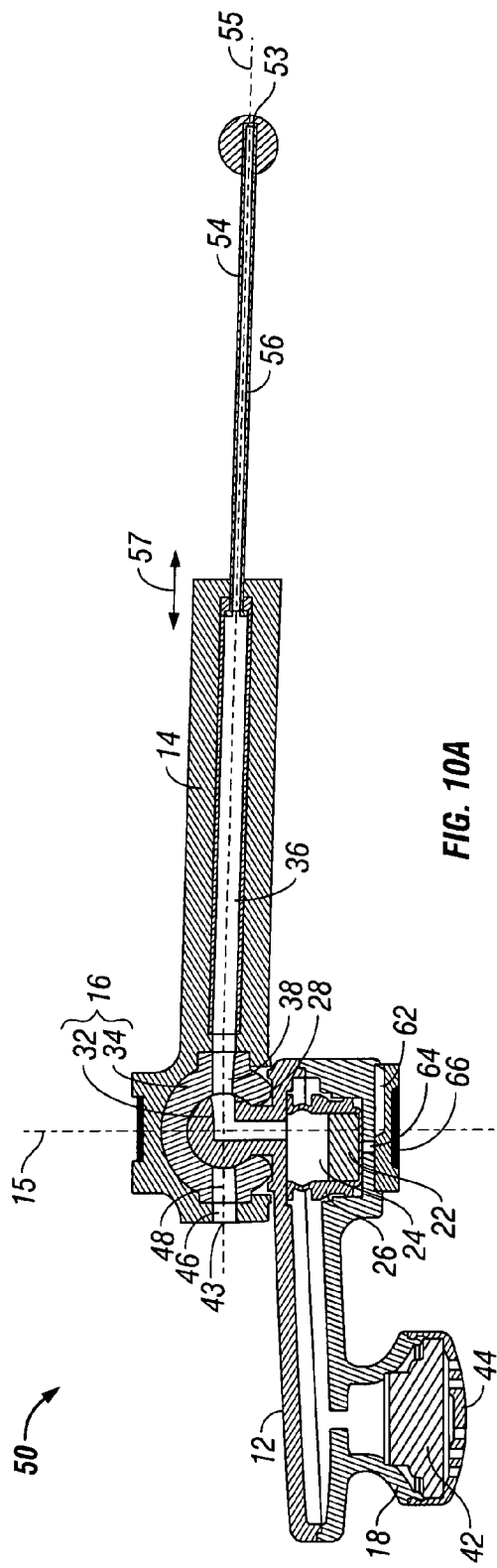
FIGS. 10(a) and (b) are cross-section views of the exemplary headset of FIG. 6, showing the headset in a doubly extended and a compact modes of operation, respectively.

According to another aspect of the present disclosure, the sensitivity of the microphone can be mechanically adjusted in response to the boom's position to accomplish noise masking. An exemplary mechanical control mechanism is illustrated in FIGS. 10(a) and (b) for the headset 50, although those skilled in the art will readily recognize that the same mechanism can also be used, for example, in the headset 10. The mechanical control mechanism is made possible with the use of a specific type of microphone that is recognized in the field as a noise-canceling, close-talking, or directional microphone. This type of microphone is often used in communications headsets for its proximity effect. Proximity effect denotes the fact that this type of microphone is more sensitive to a nearby sound source than it is to distant sources producing the same sound level at the microphone location. As it is readily recognized by those skilled in the art, this type of microphone is provided with sound ports on both sides of the microphone diaphragm, rather than only on one side, as in omnidirectional microphones, which are sealed on one side.

It is also readily recognized by those skilled in the art that a capacitive microphone, such as an electret condenser microphone, has a sensitivity that is a function of the effective stiffness of its diaphragm, and that the greater the effective stiffness of the diaphragm, the less sensitive is the microphone. If the diaphragm is coupled to one or more sealed cavities, the effective stiffness of the diaphragm is the sum of the self-stiffness of the diaphragm and the stiffness of the "air springs" that the diaphragm forms with the acoustic cavities to which it is coupled.

Therefore, according to one embodiment of the present disclosure, it is possible to use one side of a bi-directional capacitive microphone to pick up sound, and to control the sensitivity of the microphone by varying the volume of an acoustic cavity adjoining the opposite side of the microphone. When the volume of a sealed acoustic cavity adjoining a given side of a bi-directional condenser microphone is small, the effective stiffness of the diaphragm is high, and hence, the sensitivity of the microphone to acoustic pressure at the other side of the diaphragm is low. It should be noted that when a bi-directional microphone is used in this fashion, its effective sound pickup characteristic will be omnidirectional, and that the microphone will not exhibit the proximity effect discussed above.

Figure 10B:
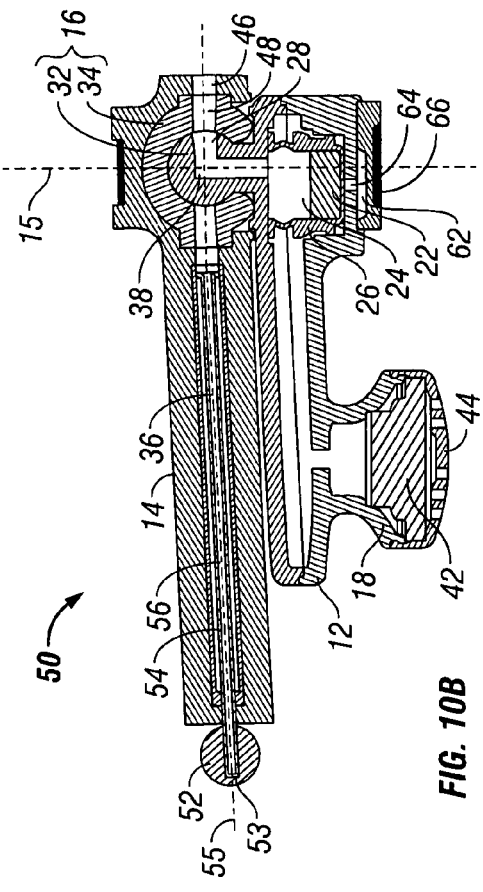

As illustrated in FIG. 10(a), in addition to the acoustic cavity 24 located above the microphone 22, two additional acoustic cavities 62 and 64 are included below the microphone 22. In this embodiment, the microphone 22 is bi-directional. One skilled in the art will recognize that unidirectional or cardioid microphones may also be used, but that omnidirectional microphones cannot. In the arrangement of the headset 50 illustrated in FIG. 10(a), the cavity 62 is not connected to the other cavities 24 and 64. Also, the microphone 22 adjoins the large cavity 24 disposed above it, but is exposed only to the small cavity 64 on its other side. Hence, the microphone 22 is relatively insensitive to the sound input in this arrangement. On the other hand, if the boom 14 is repositioned such that the acoustic cavity 62 is acoustically coupled with the acoustic cavity 64, as is illustrated in FIG. 10(b), the total volume of the acoustic cavities to which the microphone is exposed is made much larger. Hence, the microphone is more sensitive to sound input when the boom 14 is disposed as shown in FIG. 10(b). This increase in microphone sensitivity compensates for the increased distance of the acoustic sensing point from the desired acoustic source when the acoustic sensing point is located at the opening 43 in this compact operating mode. In contrast, when the headset 50 operates in the extended mode, as shown in FIG. 10(a), the acoustic sensing point is located at the opening 53, which is disposed relatively close to the desired acoustic source.

Accordingly, the microphone operates with less sensitivity. Hence, the noise reception by the microphone is reduced.

In the exemplary embodiment described above, the change in the position of the cavity 62 with respect to the microphone 22 and the cavity 64 is facilitated by a rotation clip assembly 66. As illustrated in FIGS. 10(a) and (b), the clip assembly 66 is adapted to rotate the acoustic cavity 62 around the axis 15 in sync with the boom 14. The acoustic cavity 62 is enclosed by the main body 12 on the top and by the clip assembly 66 on all other sides. It is therefore arranged to rotate relative to the main body 12 about the axis 15 when the clip assembly 66 rotates about the axis 15. When the boom is in the folded position, as shown in FIG. 10 (b), the volume of the acoustic cavity 62 is added to the volume of the acoustic cavity 64, as described above, and as a result, the microphone 22 becomes more sensitive to the sound pressure in the acoustic cavity 24. It will, however, be readily apparent to one skilled in the art that the cavity 62 can be located in a variety of different positions within the headset 50, and that many different mechanisms may be utilized to align or re-align the acoustic cavities among each other and with the microphone 22.

Another exemplary embodiment in accordance with this aspect of the present disclosure is illustrated in FIGS. 11(a) and (b). This embodiment incorporates an alternative design of the acoustic valve, in which an electret condenser type bi-directional microphone 22 is sandwiched between two acoustic cavities 24a and 24b, each connected to a link tube 78, 88. As the cylindrical tube forming the valve shell turns with the boom 14, the link tubes 78, 88 are selectively coupled with a sound tube 36, 46 to form an active acoustic channel. The acoustic cavity not coupled becomes a sealed cavity, the volume of which then affects the sensitivity of the microphone as discussed above. Hence, when the headset 20 is operating in the extended-boom mode illustrated in FIG. 11(a), the acoustic sensing point is disposed close to the desired acoustic source, but the small cavity 24b that is then acoustically coupled to the microphone 22 reduces the microphone sensitivity. Conversely, when headset 20 is operating in the compact mode illustrated in FIG. 11(b), the acoustic sensing point is disposed further away from the desired acoustic source, but the microphone 22 is now more sensitive to the desired source because it is acoustically coupled to a larger cavity 24a.

Yet another exemplary embodiment according to the mechanical noise masking aspect of the present disclosure is illustrated in FIGS. 12(a) and (b). There, a folding-retracting headset 60 is illustrated in the doubly extended mode and the compact mode, respectively. The headset 60 is very similar to the headset 50 in design and function, and the schematic illustration of the different modes of operation in FIG. 7 is thus equally applicable to the headset 60. It should be noted, however, that the acoustic sensing point 43 in the compact mode lies on the main body 12 instead of on the boom 14 in the headset 60. The similarity between headsets 50 and 60 ends in the configuration of the acoustic valve. In the headset 60, the microphone 22 is acoustically coupled through the link tube 28 with one of the alternative link tubes 38 and 48, which in turn, are acoustically coupled to the sound tubes 36 and 56 in the booms 14 and 54, respectively, or to the short sound tube 46 leading to the opening 43 on the main body 12. Thus, in the compact mode of operation, the opening 43 functions as the acoustic sensing point.

As illustrated in FIGS. 12(a) and (b), the mechanically implemented noise masking mechanism in the headset 60 relies on a plunger 88. When the boom 14 is unfolded so that the headset 60 operates in the extended or doubly extended mode, the plunger 88 is depressed, thereby decoupling the acoustic cavity 84 from the directional microphone 22. Thus, the sensitivity of the microphone 22 is reduced. In this case, the plunger seals off all microphone ports on one side of the diaphragm, and the effective acoustic cavity coupled to the diaphragm is internal to the microphone, and thus, not seen. On the other hand, when the boom 14 is folded and the secondary boom 54 retracted inside the boom 14, the headset 60 operates in the compact mode and the plunger 88 is not depressed because of the dent 86 included in the boom 14. Hence, the microphone is coupled to the acoustic cavity 84. As a result, the sensitivity of the microphone 22 is higher than in the extended operating mode.

Noise Masking Mechanisms Utilizing Acoustic Means

According to yet another aspect of the present disclosure, acoustic attenuation can be utilized for noise masking purposes. In one exemplary embodiment of the present disclosure, the ratio of the amplitude of the acoustic signals reaching the microphone to the amplitude of the input acoustic signals at the acoustic sensing point can be adjusted by changing the acoustic absorption or impedance mismatch in the acoustic channel that acoustically couples the microphone to the acoustic sensing point, such as the sound tube 36 linking the opening 13 on the boom 14 to the microphone 22 in the extended mode of operation, as illustrated in FIG. 5(a). This may be accomplished, for example, by disposing acoustic energy attenuating elements inside or along the wall of the long sound tube 36. Wadding material, such as wool yarn, can be used for this purpose. Hence, when the headset is operating in an extended mode, the active acoustic channel comprises the long sound tube 36, which includes the acoustic energy attenuating elements that induce transmission loss. This higher transmission loss, however, is balanced with the reduced distance between the acoustic sensing point and the desired sound source.

In contrast, when the headset 10 or 50 is operating in the compact mode, the distance between the acoustic sensing point and the desired sound source is smaller, but the transmission loss between the acoustic sensing point and the microphone is also lower, since the sound tube 46 is shorter and free of any acoustic energy attenuators. As a result, the sensitivity of the headset to the user's voice is substantially unaffected by boom position, whereas, its sensitivity to ambient noise is lower when it used in the extended-boom mode of operation, as depicted in FIG. 5(a). Alternatively, the inner diameter of the tube 36 can be made sufficiently small or be subdivided into a sufficiently large number of parallel tubes having small cross sections to induce acoustic resistance. The result is the same as that discussed above, namely, that the higher transmission loss is matched with a shorter distance to the desired acoustic source and vice versa. When a secondary boom is included in the communications headset, such as the headset 50 of FIG. 6, the inside bore of the boom 14 may be lined with sound absorbing material, such as felt or cork, and the secondary boom can be made of materials with little or no transmission loss, such as stainless steel. Thus, the more the secondary boom is extended towards the desired acoustic source, the more transmission loss is added into the active acoustic channel. When the secondary boom is partly extended, the active acoustic channel comprises the sound tube 56, part of the sound tube 36, the link tube 38 and the bent link tube 28.

An alternative way to reduce acoustic pressure in the long sound tube 36 is by giving it a reverse exponential horn shape or a similarly tapered waveguide shape, in which the cross section increases from a small area at the distal end of the boom 14 or the secondary boom 54 to a larger area near the microphone 22. Conversely, the short sound tube 46 may be given, for example, an exponential horn shape to increase the acoustic pressure at the microphone relative to that at the acoustic sensing point. Thus, when the headset 10 or 50 operates in the extended or double-extended mode, the acoustic sensing point is disposed close to the desired acoustic source, but there is a larger transmission loss or acoustic impedance mismatch in the boom by virtue of the long sound tube 36 being used. On the other hand, when the headset 10 or 50 operates in the compact mode, the desired acoustic source being disposed further away from the acoustic sensing point is compensated for by increasing the acoustic conductivity between the acoustic sensing point and the microphone.

Further Aspects of the Present Disclosure

According to another aspect of this disclosure, the spectrum of the user's voice may differ with distance from the user's mouth, and may require appropriate frequency response compensation when the acoustic sensing point is moved according to the present disclosure. As discussed above, one possible distortion is associated with the limitation of the microphone's dynamic range. Since the level of acoustic input may differ greatly between the compact and extended modes of operation (used herein to include also the double-extended mode of operation), the microphone in a foldable or slidable boom headset without a noise masking capability may result in transmit distortion. In an effort to compensate for this, either the microphone might be calibrated (with respect to sensitivity and amplification gain) to operate near the maximum of its dynamic range in the extended mode, thereby limiting the output signals in the compact mode to a relatively low level and resulting in noise in the transmit signal, or the microphone might be calibrated to operate with little headroom in the compact mode, thereby creating significant distortion when the headset operates in the extended mode. However, with the adjustment enabled by the noise masking mechanism according to the present disclosure as described above, this problem can readily be resolved, because the microphone operates over the same dynamic range of input levels in both modes of operation.

Another type of distortion arises when a noise-canceling microphone is used. In some embodiments of the present disclosure, such as the communications headset 100 of FIG. 1, a noise-canceling microphone may be placed at the distal end of the boom 104 so that it can take advantage of the proximity effect. One aspect of the proximity effect is that the directional noise-canceling microphones respond more strongly to low frequencies. As a result, noise-canceling microphones have different frequency response curves for different distances from the sound source. To compensate for the potential sound distortion associated with the proximity effect, a frequency response compensating circuit can be implemented such that different equalizations can be used for different modes of operation. In one embodiment according to this aspect of the present disclosure, control circuitry, such as those discussed above that adjust the amplification gain or the microphone sensitivity can be implemented. For example, a switch similar to the switch 68 illustrated in FIGS. 5(*a*) and (*b*) can be used to activate a particular frequency response compensation. The same switch 68 may also be used to adjust the amplification gain and the frequency response compensation at the same time.

The control circuitry described above can also be used to compensate for another type of distortion associated with the variation in the input frequency spectrum of the acoustic signals due to the different distances between the acoustic sensing point and the acoustic source when the headset operates in different modes. This variation in the frequency spectrum is a consequence of the fact that, when sound waves travel through air, higher frequencies are more attenuated than lower frequencies. Thus, for example, there is more high frequency content in the voice near a user's mouth. In another embodiment in accordance with this aspect of the present disclosure, the variation in the input frequency content can be compensated for by providing additional damping in the acoustic channel when the headset 100, 10, or 50 is used in the extended mode.

For example, absorptive material, such as wood, may be used to line the bore of the outer boom 14 of the headset 50 of FIG. 10(*a*). When the inner boom 54 is extended, more of the damping material is exposed within the acoustic channel. While the acoustic sensing point is located closer to the source thus boosting the high frequencies, the excess damping also tends to damp out the high frequencies, thus compensating for the change in frequency content. It should be noted that the same damping material can also serve the purpose of inducing transmission loss, corresponding to one of the mechanisms to mask ambient noise discussed above. Hence, the noise masking and frequency compensation mechanisms can be implemented at the same time. Those skilled in the art will recognize that this discussion applies not only to this particular embodiment, but also more generally to many noise masking and frequency compensation mechanisms.

According to yet another aspect of the present disclosure, the receive sensitivity can be changed in response to a change in the operating mode. FIGS. 13(*a*) and (*b*) illustrate an exemplary embodiment of a headset 30 incorporating an acoustic valve 16 in accordance with the pre-sent disclosure. When the headset 30 operates in the extended-boom mode, as illustrated in FIG. 13(*a*), the acoustic sensing point is disposed close to the desired acoustic source. Accordingly, the amplification gain or the microphone sensitivity will be reduced in one of the ways described above. However, in this particular embodiment, the receive sensitivity is also changed. To accomplish this, a receive controller is provided that is capable of changing the ratio of the amplitude of the acoustic signal output by the speaker 42 to the amplitude of the electrical input signal that the speaker receives, i.e., the receive sensitivity of the headset. When headset 30 operates in the compact mode, as illustrated in FIG. 13(*b*), the headset's receive sensitivity is reduced to a level that is appropriate for use in a relatively quiet environment.

FIGS. 13(*a*) and (*b*) also illustrate two conducting elements 94*a* and 94*b* and a resistive element 96, such as a carbon strip, which can be utilized together to selectively modify the resistance in the receive controller circuit. A person skilled in the art will recognize that when the boom 14 is folded, as illustrated in FIG. 13(*b*), the resistance of the resistive element 96 will be disposed in parallel with the voice coil resistance of the speaker 42. As a result, if the source impedance is sufficiently high, the signal, which can be applied across the terminals 94*a* and 94*b*, is attenuated when the boom is folded. Conversely, when the boom 14 is extended, as illustrated in FIG. 13(*a*), the resistive element 96 is disconnected, and the voltage across the speaker terminals will therefore be greater for the same input. With a low impedance source, the receive signal is applied across terminals 94*b* and 94*c*, such that in the extended boom mode, resistance 92 operates in series with the voice coil of the speaker. When the boom is folded, as shown in FIG. 13(*b*), the resistive element 96 is inserted in parallel with the speaker, and the voltage across the speaker terminals is attenuated. Those skilled in the art will recognize that it is also possible to mechanically couple a switching mechanism to the boom such that a resistor, which operates in series with the speaker when the boom is folded, is replaced with a conductor when the boom is extended.

Although the disclosure has been described in considerable detail with reference to certain exemplary embodiments, other embodiments are possible. As will be appreciated by those of skill in the art, the disclosure may be embodied in other specific forms without departing from the essential characteristics thereof, and that there are other means of implementing a communications headset that operates in multiple modes and arrangements, with at least a mode of operation that includes a noise masking mechanism.

For example, there are other ways to cause control circuits to adjust the microphone amplification gain or microphone sensitivity. Similarly, the volume of coupled acoustic cavities may be changed by a mechanism other than those described, such as the sliding of a slidable boom. Also, the inner boom 54 of headset 50 (illustrated in FIG. 6) may be utilized to control the various electrical or mechanical means to control the sensitivity of the headset to sound pressure at the acoustic sensing point. Additionally, those skilled in the art will recognize that other headset configurations are suitable for use with various aspects of the present disclosure. By way of example, the secondary boom 54 may be coupled to the primary boom 14 by a pivoting mechanism instead of a sliding mechanism.

Accordingly, the present disclosure is intended to embrace all such alternatives, modifications and variations as fall within the spirit and scope of the appended claims and equivalents. It should also be evident that, while communications headsets are used to illustrate the concepts, the applications thereof are not limited to headsets or communication devices, but are generally applicable to devices that provide an electrical output signal in response to acoustic pressure at a particular sound source in the presence of noise, whether or not the noise is of an acoustic nature.

What is claimed is:

1. A headset capable of applying a change in amplitude to an
input signal, the headset comprising:
a main body locatable at a given distance from a desired acoustic source;
a boom, movably coupled to the main body and adapted to be positioned in at least a first position and a second position relative to the desired acoustic source;
a microphone, wherein the microphone is active when the boom is in the first position and second position;
an acoustic sensing point, acoustically coupled to the microphone, wherein the acoustic sensing point is disposed at different distances from the desired acoustic source when the boom is in at least the first position or the second position; and
an electrical controller, operably coupled to the boom, for applying a different change in amplitude to the input signal dependent on whether the boom is in the first position or second position without moving the main body relative to the desired acoustic source.

2. The headset of claim 1, wherein the amplitude of the input signal is decreased in response to decreasing the distance of the boom from the desired acoustic source.

3. The headset of claim 1, wherein the amplitude of the input signal is increased in response to increasing the distance of the boom from the desired acoustic source.

4. The headset of claim 1, wherein the boom is a telescoping boom.

5. The headset of claim 1, wherein the acoustic sensing point s positioned at a distal end of the boom.

6. The headset of claim 5, wherein the microphone is positioned at a distal end of the boom.

7. The headset of claim 1, further comprising a wireless communication module.

8. The headset of claim 1, wherein the controller is adapted to change the sound pressure sensitivity of the microphone.

9. The headset of claim 8, wherein the microphone is of a capacitive type; and the controller is adapted to change a bias voltage of the microphone.

10. The headset of claim 1, wherein the control is adapted to change a gain that is applied to a microphone output.

11. A headset for providing an output signal that is derived from an acoustic source, comprising:
a main body;
a boom, movably coupled to the main body and adapted to be positioned in at
least a first position and a second position relative to the main body;
a microphone, wherein the microphone is active when the boom is in the first position and second position; and
an electric controller that is operabiy coupled to the boor land that is responsive to moving the boom from the first position to the second position, for applying a different gain to the output signal dependent on whether the boom is in the first position or the second position.

12. The headset of claim 11, further comprising a switch engaged by the movement of the boom between the first and second position, and to which the controller is responsive.

13. The headset of claim 11, wherein the controller is adapted to change the sound pressure sensitivity of the microphone.

14. The headset of claim 13, wherein the microphone is of a capacitive type; and the controller is adapted to change a bias voltage of the microphone.

15. The headset of claim 11, the headset further comprises an electric circuit for modifying the output signal.

16. The headset of claim 15, wherein the controller is adapted to change a gain that the electric circuit applies to a microphone output.

17. The headset of claim 15, wherein the controller is adapted to change the frequency response the electric circuit applies to a microphone output.

18. The headset of claim 11, wherein the boom is adapted to telescopically extend or retract linearly along the boom axis.

19. The headset of claim 11, wherein the microphone is positioned In the main body.

20. The headset of claim 11, wherein the microphone is positioned in the boom.

21. The headset of claim 11, wherein the ratio of the amplitude of the output signal to an amplitude of the sound pressure in the vicinity of the desired acoustic source when the boom is in the first position is substantially equal to the ratio of the amplitude of the output signal to an amplitude of the sound pressure in the vicinity of the desired acoustic source when the boom is in the second position.

* * * * *